United States Patent
Yi et al.

(10) Patent No.: US 9,979,371 B1
(45) Date of Patent: May 22, 2018

(54) ELLIPTIC DIRECTIONAL FILTERS FOR A COMBINER CIRCUIT

(71) Applicant: Futurewei Technologies, Inc., Plano, TX (US)

(72) Inventors: Huairen Yi, Somerset, NJ (US); Zhengxiang Ma, Summit, NJ (US)

(73) Assignee: Futurewei Technologies, Inc., Plano, TX (US)

( * ) Notice: Subject to any disclaimer, the term of this patent is extended or adjusted under 35 U.S.C. 154(b) by 0 days. days.

(21) Appl. No.: 15/448,502

(22) Filed: Mar. 2, 2017

(51) Int. Cl.
*H04B 1/00* (2006.01)
*H03H 7/01* (2006.01)
*H04W 88/08* (2009.01)

(52) U.S. Cl.
CPC .......... *H03H 7/0115* (2013.01); *H04W 88/08* (2013.01)

(58) Field of Classification Search
CPC ............................... H04B 1/0064; H04B 1/04
USPC .......................... 455/272, 273, 278.1, 562.1
See application file for complete search history.

(56) References Cited

U.S. PATENT DOCUMENTS

| | | | | |
|---|---|---|---|---|
| 2004/0036554 A1* | 2/2004 | Veyres | ................. | H03H 7/0115 333/167 |
| 2004/0201527 A1* | 10/2004 | Hani | .................... | H01Q 1/243 343/702 |
| 2005/0237260 A1* | 10/2005 | Bancroft | ................... | H01P 5/10 343/859 |
| 2008/0204327 A1* | 8/2008 | Lee | .......................... | H01Q 1/38 343/700 MS |
| 2015/0263420 A1* | 9/2015 | Wu | ........................ | H01Q 1/523 455/78 |
| 2016/0006119 A1* | 1/2016 | Wu | ........................ | H01Q 1/523 343/853 |
| 2016/0126622 A1* | 5/2016 | Cheng | ....................... | H01P 7/10 343/860 |
| 2016/0126623 A1* | 5/2016 | Maxim | ................. | H01L 23/315 343/860 |
| 2016/0191012 A1* | 6/2016 | Khlat | ..................... | H03H 9/542 333/189 |

* cited by examiner

*Primary Examiner* — Wen Huang
(74) *Attorney, Agent, or Firm* — Futurewei Technologies, Inc.

(57) ABSTRACT

An elliptic combiner circuit filters a first and second signal in a first and second frequency band. A first resonator is coupled to a first input via a first capacitor and a second input via a second capacitor. A second resonator is coupled to a first and second signal path, coupled to the first and second input, via a third and a fourth capacitor. A first inductor is coupled between the first and third capacitors, and between the second and fourth capacitors. A third resonator is coupled to the first and second signal paths via a fifth, sixth, and seventh capacitors. A fourth resonator is coupled to the first signal path and a terminated port via an eighth, ninth and tenth capacitors. A second inductor is coupled between the fifth and eighth capacitors, and between the seventh and tenth capacitors. An output outputs the first and second signals.

21 Claims, 12 Drawing Sheets

| | | |
|---|---|---|
| Insertion Loss | 690-862 MHz | 0.7 dB |
| Insertion Loss | 880-960 MHz | 0.7 dB |
| Isolation | 690-862 MHz | 34 dB |
| Isolation | 880-960 MHz | 34 dB |

*Fig. 3*

ELLIPTIC DIRECTIONAL FILTERS FOR A COMBINER CIRCUIT

BACKGROUND

Telecommunication systems for wireless or cellular communications often have an antenna, or an array of antenna elements, that emits and receives radio frequency (RF) signals to and from end user equipment (UEs). Complex circuits are used to provide electrical signals to the array of antenna elements so that the appropriate RF signals are radiated to a selected UE. Similarly, complex circuits may be used to convert received RF signals to electrical signals having information.

Different types of circuits may be used to filter and/or combine signals from an antenna. For example, a directional filter having a pair of 3 decibel (dB) hybrids may be used. Cascaded directional filters may also be used. Bandpass/bandstop and bandpass diplexer circuits may also be used.

SUMMARY

In one embodiment, the present technology relates a method of operating a circuit comprising receiving a first signal in a first frequency band at a first input and a second signal in a second frequency band at a second input. The first and second signals are combined at a first stage that includes a first resonator coupled to a second resonator. The first and second signals are combined at a second stage that includes a first resonator having an elliptic response coupled to a second resonator having an elliptic response. The first and second stages are cascaded with a first signal path having a first length and a second signal path having a second length. The first and second signals are provided at an output of the second stage.

A second embodiment in accordance with the first embodiment, wherein the first resonator in the second stage includes a first capacitor coupled in parallel with an inductor.

A third embodiment in accordance with the first through the second embodiments, wherein a second capacitor is coupled in series with the first capacitor coupled in parallel to provide the elliptic response.

A fourth embodiment in accordance with the first through the third embodiments, wherein the elliptic response provides a zero in a frequency response.

A fifth embodiment in accordance with the first through the fourth embodiments, wherein the second stage reduces a frequency separation between the first and second signals.

A sixth embodiment in accordance with the first through the fifth embodiments, wherein the first resonator and second resonator in the second stage are inductive coupled or capacitive coupled.

A seventh embodiment in accordance with the first through the sixth embodiments, wherein the first length and second length is based on whether the first resonator and second resonator in the second stage are inductive coupled or capacitive coupled.

An eighth embodiment in accordance with the first through the seventh embodiments, wherein the first stage includes a first, second, third and fourth ports and the second stage includes a first, second, third and fourth ports, wherein the first and second ports of the first stage are capacitive coupled to the first and second inputs and the third and fourth ports of the first stage are coupled to the first and second ports of the second stage by the first and second signal paths, and wherein the third port of the second stage is capacitive coupled to the output and the fourth port of the second stage is terminated.

A ninth embodiment in accordance with the first through the eighth embodiments, wherein the first and second signal paths are first and second transmission lines.

A tenth embodiment in accordance with the first through the ninth embodiments, wherein the first frequency band is between approximately 690 MHz and approximately 862 MHz and the second frequency band is between approximately 880 MHz and approximately 960 MHz.

An eleventh embodiment in accordance with the first through the tenth embodiments, wherein an insertion loss of first signal in is less than 0.75 decibels and an insertion loss of second signal is less than 0.75 decibels.

A twelfth embodiment in accordance with the first through the eleventh embodiments, wherein an insolation of first signal is greater than 30 decibels and an isolation of second signal is greater than 30 decibels.

In a thirteenth embodiment, the technology generally relates to a circuit that comprises a first input, coupled to a first signal path, to receive a first signal in a first frequency band and a second input, coupled to a second signal path, to receive a second signal in a second frequency band. A first stage comprises a first resonator coupled to the first input via a first capacitor and the second input via a second capacitor. A second resonator is coupled to the first signal path via a third capacitor and the second signal path via a fourth capacitor. A first inductor is coupled between the first and third capacitors, and between the second and fourth capacitors. A second stage is coupled to the first stage via a first portion of the first signal path and a second portion of the second signal path that provides a phase difference of approximately 180 degrees. The second stage comprises a third resonator coupled to the first signal path via a fifth capacitor and sixth capacitor and the second signal path via the sixth capacitor and a seventh capacitor. A fourth resonator is coupled to first signal path via an eighth capacitor and ninth capacitor and a terminated port via the ninth capacitor and a tenth capacitor. A second inductor is coupled between the fifth and eighth capacitors, and between the seventh and tenth capacitors. An output is coupled to the second stage and outputs the first signal and the second signal.

In a fourteenth embodiment, the present technology relates to an apparatus for a cellular network comprising an antenna to receive a first signal in a first frequency band and second signal in a second frequency band from at least a user equipment. A combiner circuit that combines the first and second signals comprises a first input, coupled to a first signal path, to receive the first signal and a second input, coupled to a second signal path, to receive the second signal. A first stage comprises a first resonator coupled to the first input via a first capacitor and the second input via a second capacitor. A second resonator is coupled to the first signal path via a third capacitor and the second signal path via a fourth capacitor. A first inductor is coupled between the first and third capacitors, as well as between the second and fourth capacitor. A second stage is coupled to the first stage via a first portion of the first signal path and a second portion of the second signal path. The second stage comprises a third resonator having an elliptic response coupled to the first signal path via a fifth capacitor and a sixth capacitor and the second signal path via the sixth capacitor and a seventh capacitor. A fourth resonator having an elliptic response is coupled to the first signal path via an eighth capacitor and a ninth capacitor and the terminated port via the ninth capacitor and a tenth capacitor. A second inductor is coupled between the fifth and eighth capacitors, as well as between the seventh and tenth capacitors. The output is coupled to the eighth capacitor and first signal path to output the first and the second signals.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

FIG. 3 is a table of characteristics of a circuit according to embodiments of the present technology

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The present technology, roughly described, relates to elliptical directional filters in a combiner (or splitter in an embodiment) circuit having passbands with tight shape factors. Shape factor is defined as the ratio of stopband bandwidth and passband bandwidth in an embodiment. In an embodiment, an elliptic resonator circuit provides a finite transmission zero alongside a normal pole that significantly improves channel isolation. A combiner circuit that uses ceramic resonators according to embodiments may provide many advantages over typically used bandstop and bandpass as well as directional filter circuits.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1A:
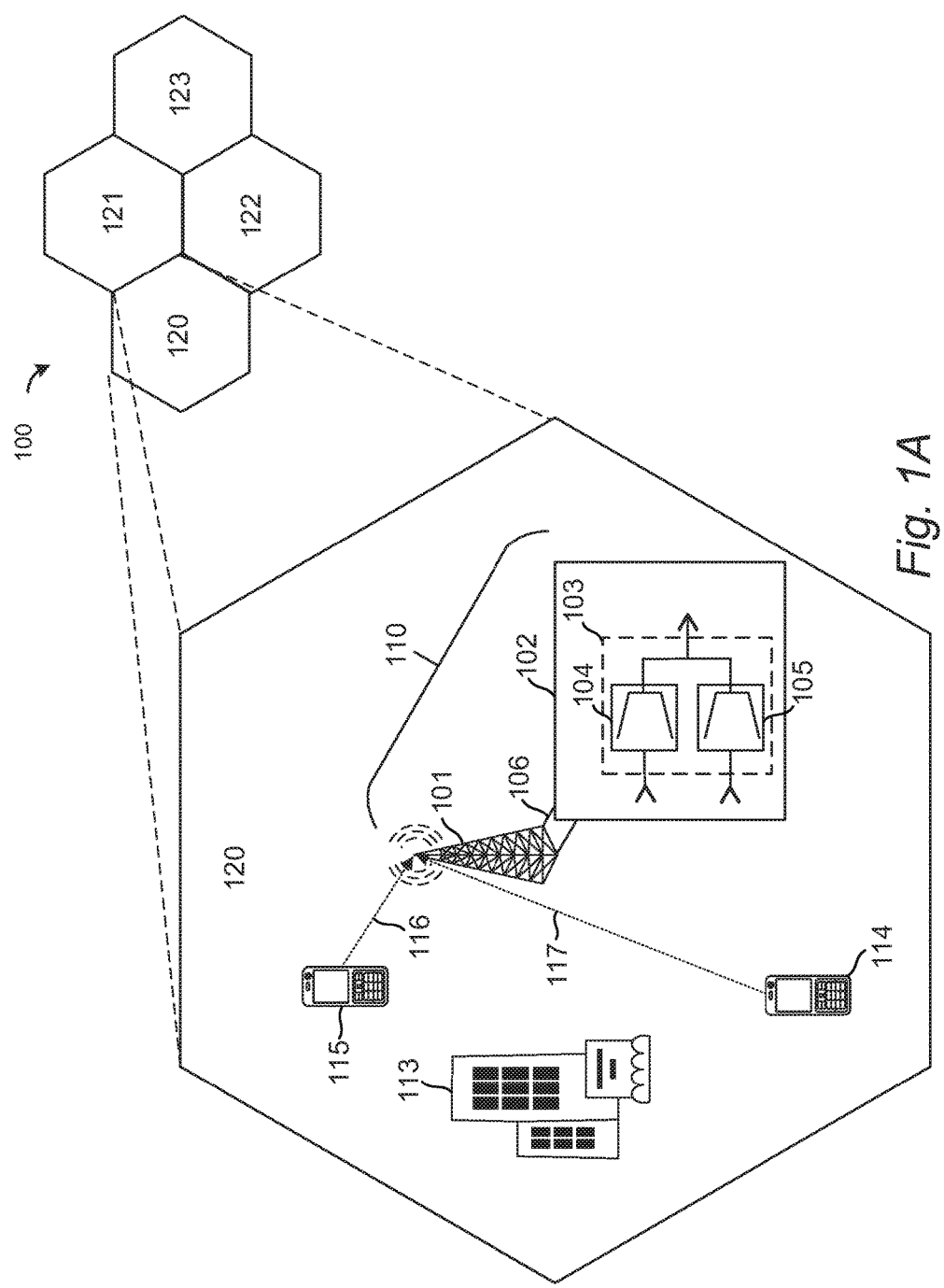
FIG. 1A is a block diagram of a combiner circuit in a cellular network according to embodiments of the present technology.
Figure 1B:
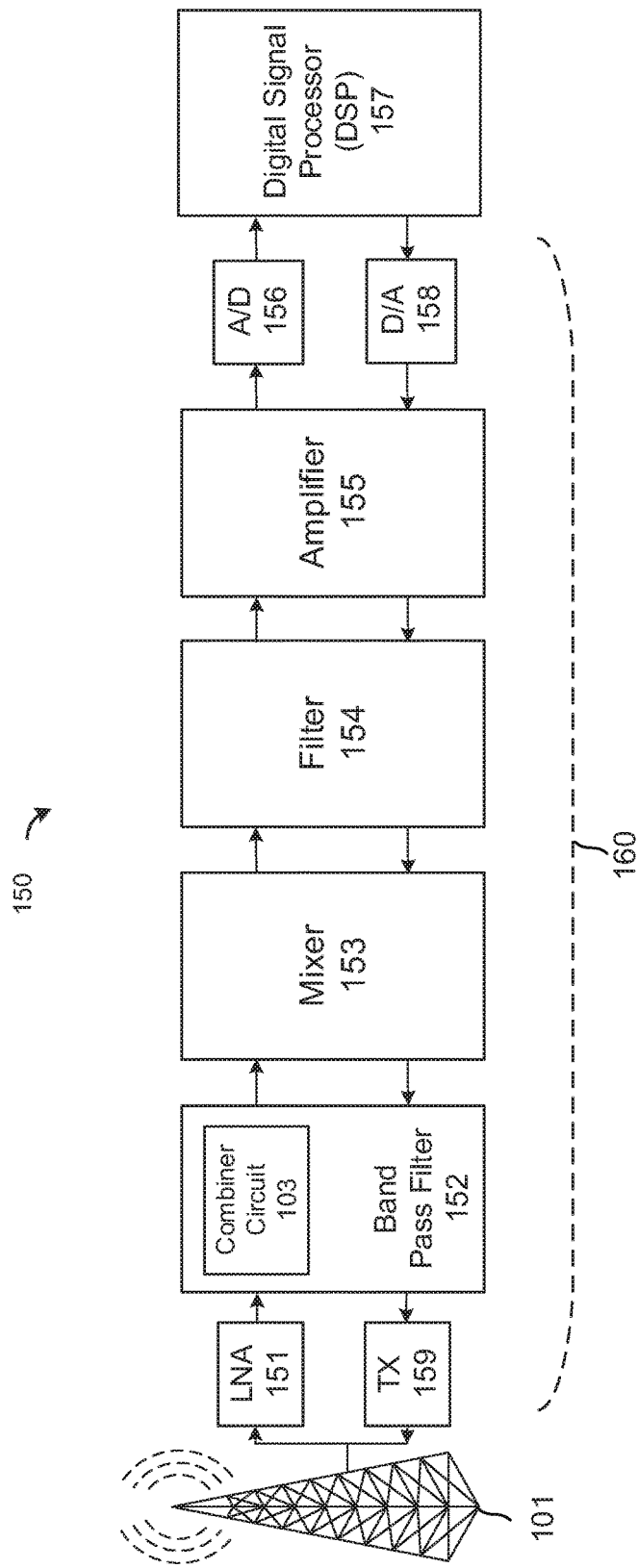
FIG. 1B is a block diagram of a circuit including a combiner circuit according to embodiments of the present technology.

FIG. 1A illustrates a system including a wireless network 100 having a plurality of cells 120-123 forming a cellular network according to embodiments of the present technology. In an embodiment, wireless network 100 includes a combiner circuit 103 having directional filters 104 and 105 as described herein. FIG. 1B described in detail below illustrates a combiner circuit 103 in a circuit 150 to receive and transmit signals, such as a transceiver. FIG. 1A also illustrates an expanded view of cell 120 having a base station (BS) 110 that communicates with one or more UEs, such as UEs 114 and 115, in cell 120. A base station 110 includes antenna 101 coupled to computing device 102 via signal path(s) 106 in an embodiment.

Antenna 101 may include a plurality of directional antennas or antenna elements and may be coupled to an antenna tower or other physical structure in embodiments. Antenna 101 may transmit and receive signals, such as orthogonal frequency division multiplexing OFDM (or signals generated in accordance with known signaling standards and future standards such as "5G" which is currently under development), to and from UEs in cell 120 in response to electronic signals from and to computing device 102. In an embodiment, antenna 101 includes a multi-input and multi-output (MIMO) antenna.

In embodiments, base station 110 includes one or more transceivers coupled to antenna 101 to transmit and receive RF signals to and from UEs 114 and 115 in cell 120. Computing device 102 may be electronically coupled to other antennas and/or other cells (base stations), such as antennas in cells 121-123, in alternating embodiments.

Cell 120 may cover a very different radio environment than one or more cells 121-123. For example, cell 120 may cover a large urban area with many large and irregularly shaped structures, such as buildings 113; while, one or more cells 121-123 may cover rural areas that may include a relatively flat topography with very few high structures. In an embodiment, UE 115 transmits a first RF signal 116 having a first frequency band range, such as 690-862 MHz, to antenna 101. In an embodiment, UE 114 transmits a second RF signal 117 having a second frequency band range, such as 880-960 MHz, to antenna 101. In an embodiment, UE 114 transmits both the first and second signals.

Figure 8:
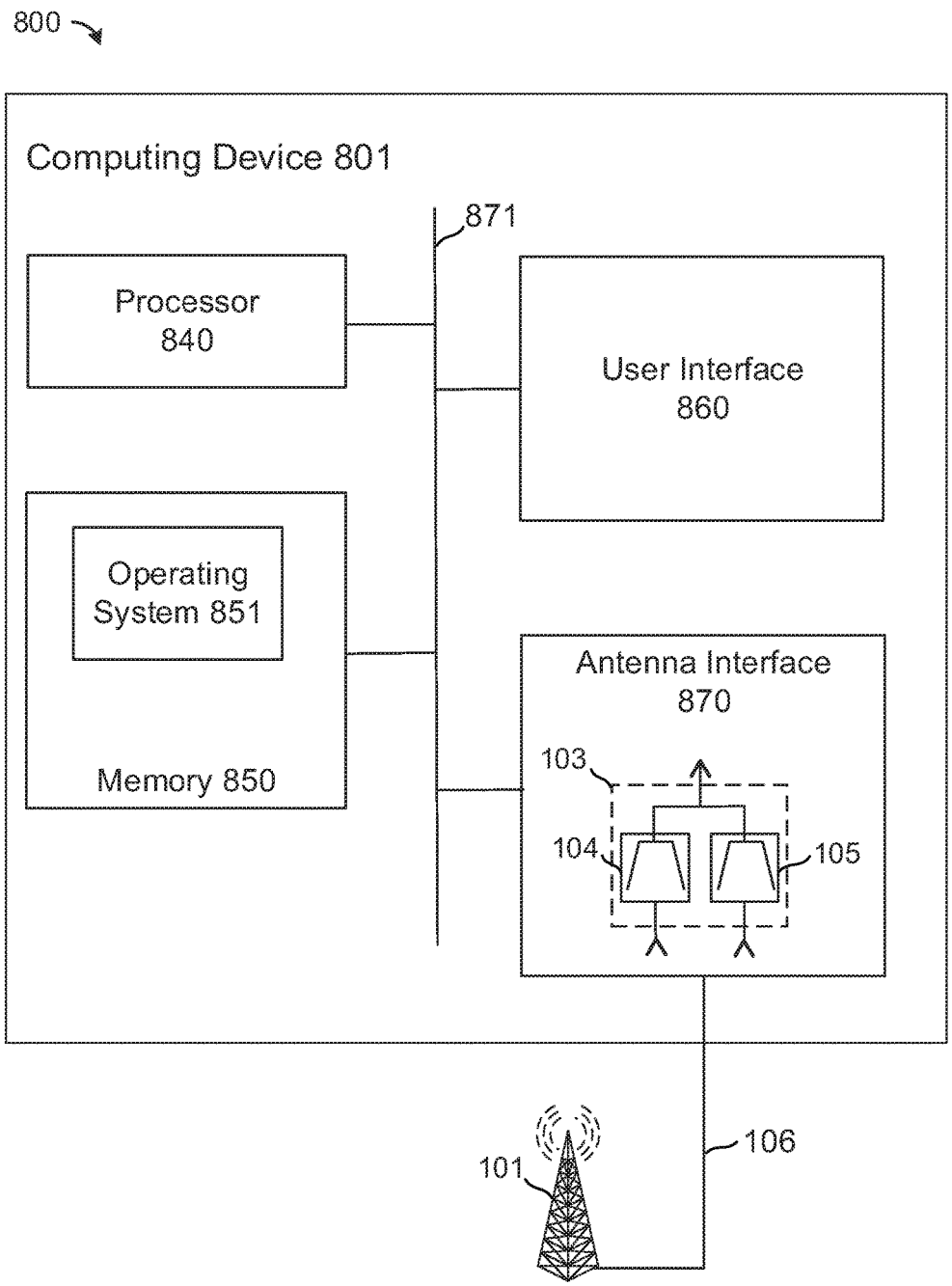
FIG. 8 is a block diagram that illustrates a hardware architecture according to embodiments of the present technology.

According to the various embodiments of the present technology, computing device 102 includes the elements of computing device 801 shown in FIG. 8 and described herein. In particular, computing device 102 includes a processor 840, user interface 860, memory 850 and antenna interface 870 that may include combiner circuit 103 having directional filters 104 and 105.

In embodiments, UEs 114 and/or 115 are also known as mobile stations (MSs). In an embodiment, UEs 114 and/or 115 conform to a SIMalliance, Device Implementation Guide, June 2013 (SIMalliance) specification. In other embodiments, UE 114 and/or UE 115 does not conform to the SIMalliance specification.

In embodiments, base station 110 may operate according to second generation (2G), third generation (3G), fourth generation (4G) base station standards/protocols and/or other standards/protocols including fifth generation (5G) base stations that are currently under development. In various embodiments, different types of cellular communication technologies may be used, such as Global System for Mobile Communications (GSM), code division multiple access (CDMA), Time division Multiple Access (TDMA) and Advanced Mobile Phone System (AMPS) (analog). In the various embodiments, different types of digital cellular technologies may be used, such as: GSM, General Packet Radio Service (GPRS), cdmaOne, CDMA2000, Evolution-Data Optimized (EV-DO), Enhanced Data Rates for GSM Evolution (EDGE), Universal Mobile Telecommunications System (UMTS), Digital Enhanced Cordless Telecommunications (DECT), Digital AMPS (IS-136/TDMA), and Integrated Digital Enhanced Network (iDEN).

In embodiments, base station 110 may be an E-UTRAN Node B (eNodeB), Node B and/or Base Transceiver Station (GBTS) BS. A GBTS may operate a variety of type's wireless technology, such as CDMA, GSM, Worldwide Interoperability for Microwave Access (WiMAX) or Wi-Fi. A GBTS may include equipment for the encryption and decryption of communications, spectrum filtering equipment, antennas and transceivers. A GBTS typically has multiple transceivers that allow it to serve many of the cell's different frequencies and sectors.

Computing device 102 may communicate or transfer information by way of wireless network 100 or an alternative network. In an embodiment, a network may include a plurality of base stations in a cellular network or geographical region having associated electronic interconnections. In an embodiment, a network may be wired or wireless, singly or in combination. In an embodiment, a network may include the Internet, a wide area network (WAN) or a local area network (LAN), singly or a combination thereof.

In an embodiment, a network may include a High Speed Packet Access (HSPA) network, or other suitable wireless systems, such as for example Wireless Local Area Network (WLAN) or Wi-Fi (Institute of Electrical and Electronics Engineers' (IEEE) 802.11x). In an embodiment, computing device 102 uses one or more protocols to transfer information or packets, such as Transmission Control Protocol/Internet Protocol (TCP/IP) packets.

FIG. 1B is a block diagram of a circuit 150 including a combiner circuit 103 according to embodiments of the present technology. In an embodiment, circuit 150 includes an antenna 101, transceiver 160 and digital signal processor (DSP) 157. In an embodiment, a combiner circuit is included in a band pass filter 152 of transceiver 160. In embodiments, combiner circuit 103 may be included in other circuit components of transceiver 160. In an embodiment, a transceiver 160 includes low noise amplifier (LNA) 151, band pass filter 152, mixer 153, filter 154, amplifier 155, analog to digital (A/D) 156, digital to analog (D/A) 158 and transmitter (TX) 159. In embodiments, more or less components are included in transceiver 160. In embodiments, the order of the circuit components may be rearranged.

A received signal from antenna 101 is provided to LNA 151 to amplify the received signal and provide the received signal to band pass filter 152 that filters the received signal. The received signal is further provided to mixer 153, filter 154 and amplifier 155. The received signal from amplifier 155 is output to ND 156 that converts the received analog signal to a digital signal. DSP 157 processes the digital received signal from A/D 156.

A transmitted signal output from antenna 101 is provided by DSP 157. In particular, DSP 157 provides a digital transmit signal to D/A 158 that outputs an analog transmit signal to amplifier 155. The amplified transmit signal is output from amplifier 155 to filter 154 that outputs the transmit signal to mixer 153. Mixer 153 then outputs the transmit signal to band pass filter 152 that outputs the transmit signal to TX 159 that transmits a RF signal from antenna 101.

Figure 2A:
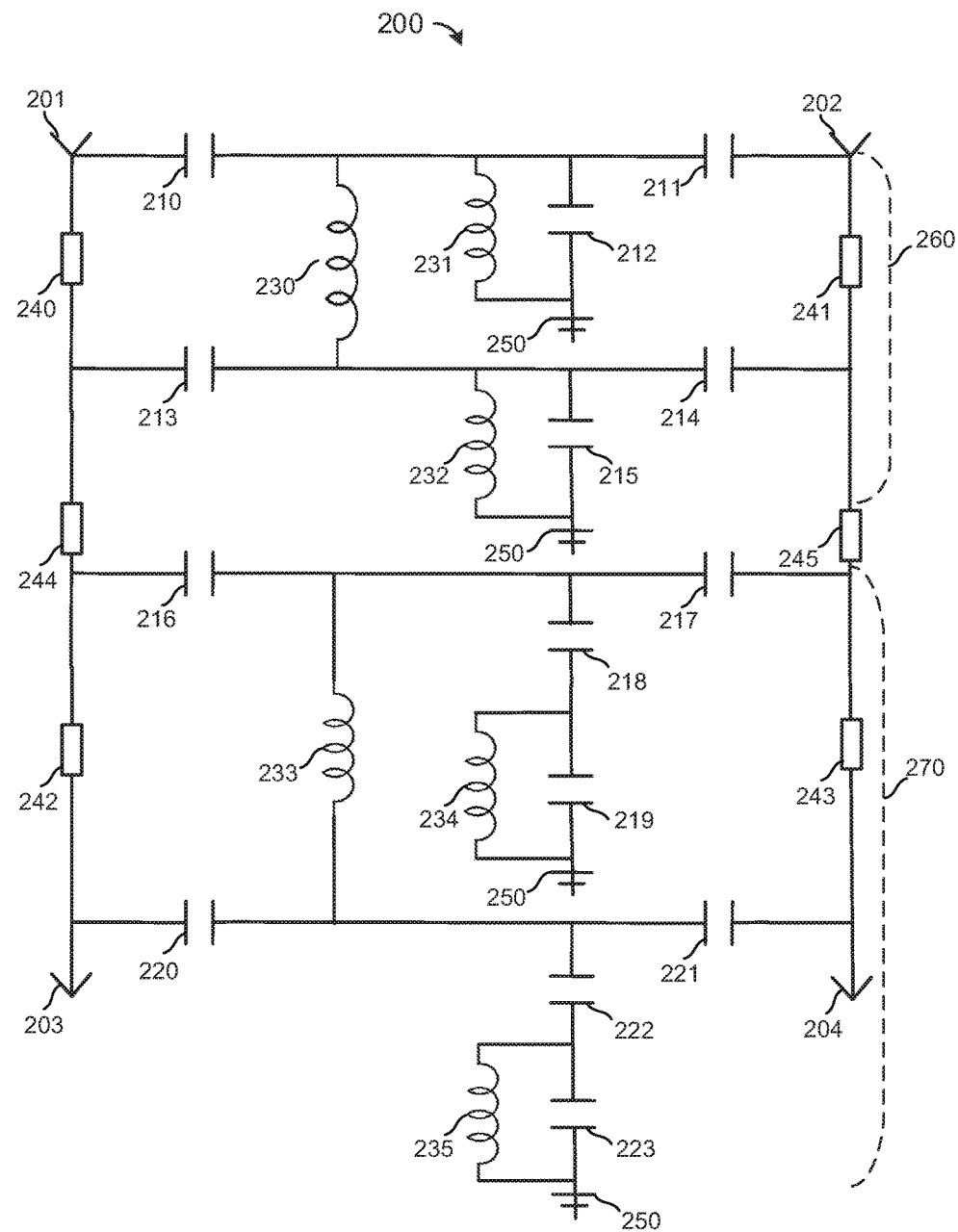
FIG. 2A is a schematic diagram of a circuit according to embodiments of the present technology.
Figure 2B:
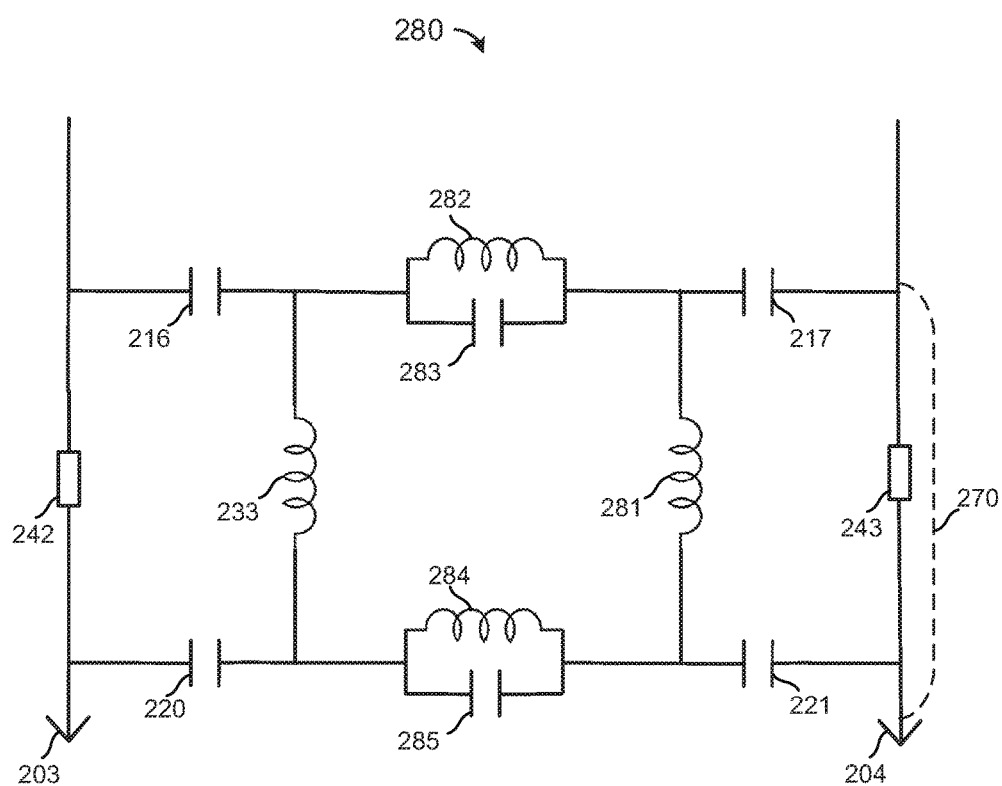
FIG. 2B is a schematic diagram of a circuit according to embodiments of the present technology.
Figure 2C:
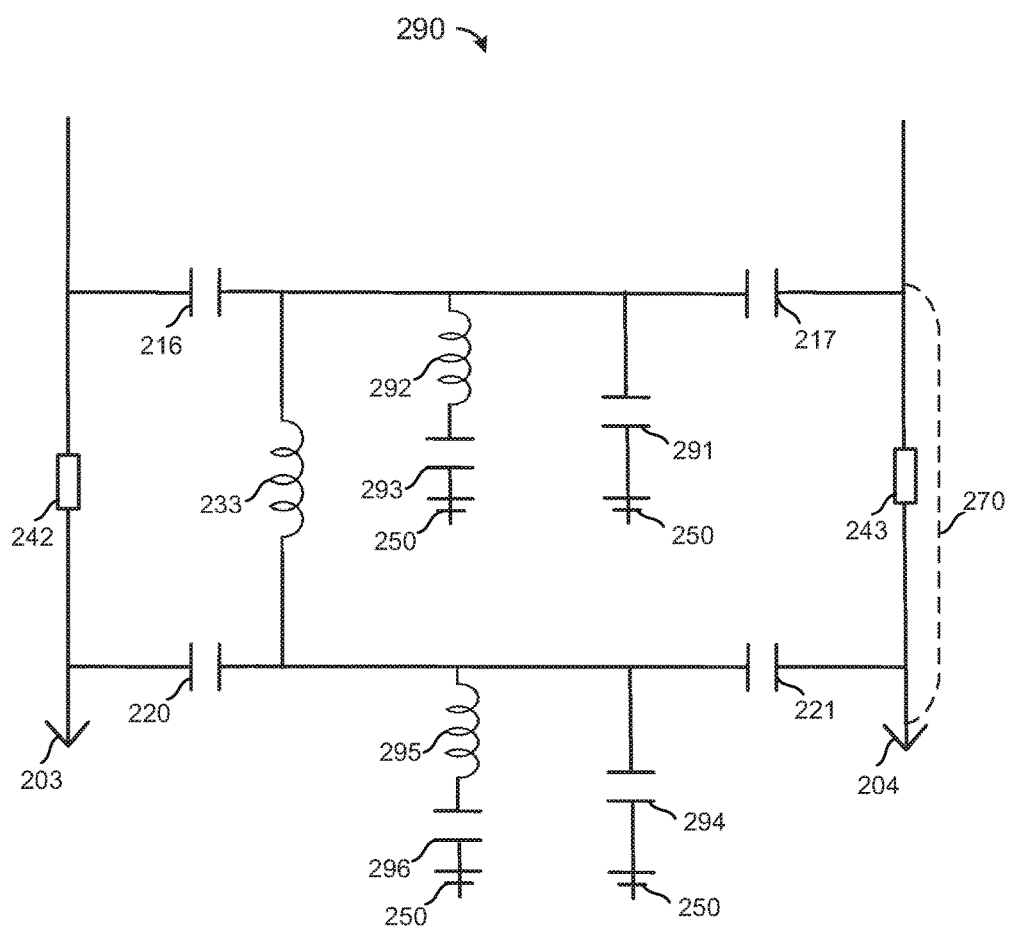
FIG. 2C is a schematic diagram of a circuit according to embodiments of the present technology.

FIG. 2A is a schematic diagram of a circuit 200 according to embodiments of the present technology. Circuit 200, for example, may be found within combiner circuit 103 in circuit 150 shown in FIG. 1B. In the described embodiment of FIG. 2, circuit 200 is an elliptic cascaded directional filter circuit that includes two stages: a first stage 260 having two inputs and two outputs and a second stage 270 having two inputs and two outputs. One output is used to provide an output signal and the other output is terminated or coupled to a load. The two stages (outputs of stage 260 are connected to the inputs of stage 270) are connected through transmission lines 244 and 245. There is a nominal phase difference of approximately 180 degrees between the signals conducted in transmission lines 244 and 245.

Generally, circuit 200 includes a cascading of two stages 260 and 270 that are connected by transmission lines 244 and 245. In an embodiment, stage 260 includes a first resonator formed by capacitor 212 and inductor 231 coupled in parallel and a second resonator formed by capacitor 215 and inductor 232 coupled in parallel. Similarly, stage 270 includes a first resonator formed by capacitor 219 and inductor 234 coupled in parallel and a second resonator formed by capacitor 223 and inductor 235 coupled in parallel.

In an embodiment, each stage includes a 4 port circuit containing two coupled resonators. The resonators may be coupled either through inductive or capacitive coupling. FIG. 2A illustrates inductive coupling by using inductors 230 and 233 in FIG. 2. The coupled resonators is stage 260 are coupled to the 4 ports through a set of capacitors, such as capacitors 210, 211, 213 and 214 shown in FIG. 2. Transmission lines 240 and 241 connect the 2 input ports of stage 270 to the 2 output ports of stage 260. Each stage produces a combiner function in an embodiment. However in an embodiment, a single stage combiner functions only over a relatively narrow bandwidth around its respective center frequency for one of the input branches, and the frequency separation between the two signals combined through the two input ports is relatively large.

Cascading the two stages 260 and 270 with an appropriately selected length of transmission line 244 and 245 results in a combiner that function over a wider bandwidth and can support reduced frequency separation between the two input signals being combined in an embodiment. In alternate embodiments, more than two stages may be used. In In one or more stages, the two coupled resonators may have a zero in its frequency response (elliptic response) through the introduction of an additional capacitor. For example, capacitors 218 and 222 are coupled in series to the two coupled resonators in stage 270 shown in FIG. 2. The use of a resonator with an elliptic response enables wide bandwidth for the lower frequency input signals in an embodiment. In an embodiment, a circuit including multiple stages may or may not have a stage that includes an elliptic response.

In an embodiment, depending on the resonator technology used, various circuit components may be used to achieve the capacitive or inductive coupling between the resonators. In an embodiment, transmission line lengths may need to be adjusted accordingly depending on whether capacitive or inductive couplings between resonators are employed. Alternatively, any of the transmission lines may also be implemented using lumped element inductors and capacitors.

First stage 260 includes an input 201 and an input 202 that may receive a first signal and a second signal respectively. A first signal may have a first frequency band range, such as 690-862 MHz and a second signal may have a second frequency band range, such as 880-960 MHz. Inductor 231 and capacitor 212 form a first resonant circuit. The first resonant circuit is coupled to the main signal paths through capacitors 210 and 211, respectively. Inductor 232 and capacitor 215 form a second resonant circuit. The second resonant circuit is coupled to the main signal paths (transmission lines) through capacitors 213 and 214, respectively. The first and second resonant circuits are identical in an embodiment, and they are also coupled together through inductor 230. In circuit 200, both resonator circuits are connected to ground (or common) reference 250, indicating that both resonant circuits are quarter wave length resonators in an embodiment. In another embodiment, half wave length resonators may be used and then connect neither resonant circuits to ground reference 250.

In an embodiment, inductor 230 may be split into two identical inductors coupled in parallel (each having doubled values as inductor 230). One of the two, together with capacitors 210, 213, and transmission line 240 (approximate 90 degrees nominal) form a 3 dB hybrid circuit in an embodiment. The other one, together with capacitors 211, 214, and transmission line 241 (approximate 90 degrees nominal) form another 3 dB hybrid circuit in an embodiment.

Second stage 270 includes two identical elliptic resonant circuits in an embodiment: a first is formed by inductor 234, capacitor 219, and capacitor 218, and a second is formed by inductor 235, capacitor 223, and capacitor 222. They are coupled to the main signal paths through capacitors 216, 217, 220, 221, respectively. These two resonant circuits are also coupled together through inductor 233. Similar to above, inductor 233 may be split into two identical inductors. One of them, together with capacitors 216, 220, and transmission line 242 (approximate 90 degree nominal) form a 3 dB hybrid circuit in an embodiment. The other one, together with capacitors 217, 221, and transmission line 243 (approximate 90 degrees nominal) form another 3 dB hybrid circuit in an embodiment.

In an embodiment, transmission lines 240, 244 and 242 couple input 201 to output 203. Similarly, transmission lines 241, 245 and 243 couple input 202 to output (or terminated port) 204. In embodiment, transmission lines 240, 244 and 242 form a first signal path and transmission lines 241, 245 and 243 form a second signal path. In an embodiment, transmission line 244 is a first portion of the first signal path and transmission line 245 is a second portion of the second signal path.

An output signal is provided at output 203 that includes combined and filtered input signals that are received at inputs 201 and 202.

In embodiments, circuit 200, as well as circuit 500, may be included in a printed circuit board and/or integrated circuit device.

FIG. 3 is a table 300 of characteristics of a circuit according to embodiments of the present technology based on resonators with unloaded Q factor (quality factor) of 800. In an embodiment, table 300 illustrates the circuit characteristics or specifications' of circuits 200 and/or 500 illustrated in FIGS. 2 and 5. In an embodiment, a first signal input to a circuit has a frequency band of between approximately 690 MHz and approximately 862 MHz and a second signal input to a circuit has a frequency band of between approximately 880 MHz and approximately 960 MHz. In an embodiment, the first signal has an insertion loss of approximately 0.7 dB or less than approximately 0.75 dB. In an embodiment, the second signal has an insertion loss of approximately 0.7 dB or less than approximately 0.75 dB. In an embodiment, the first signal has an isolation of approximately 34 dB or greater than approximately 30 dB. In an embodiment, the second signal has an isolation of approximately 34 dB or greater than approximately 30 dB.

In embodiments, circuits 200 and/or 500 provide significant performance advantages as compared to bandstop and bandpass circuits as well as typical directional filter circuits. For example, a bandstop and bandpass circuit may have too high of an insertion loss which may require a higher unloaded Q resonator. However the higher Q resonator may require a much bigger package size and weight. The size and weight of the higher Q resonator may be twice as much when used with a cavity filter.

Typical directional filter circuits with two stages may not meet isolation requirements. Adding more stages may improve isolation to 30 dB, but may add additional insertion loss, package size, cost and complexity.

Figure 4:
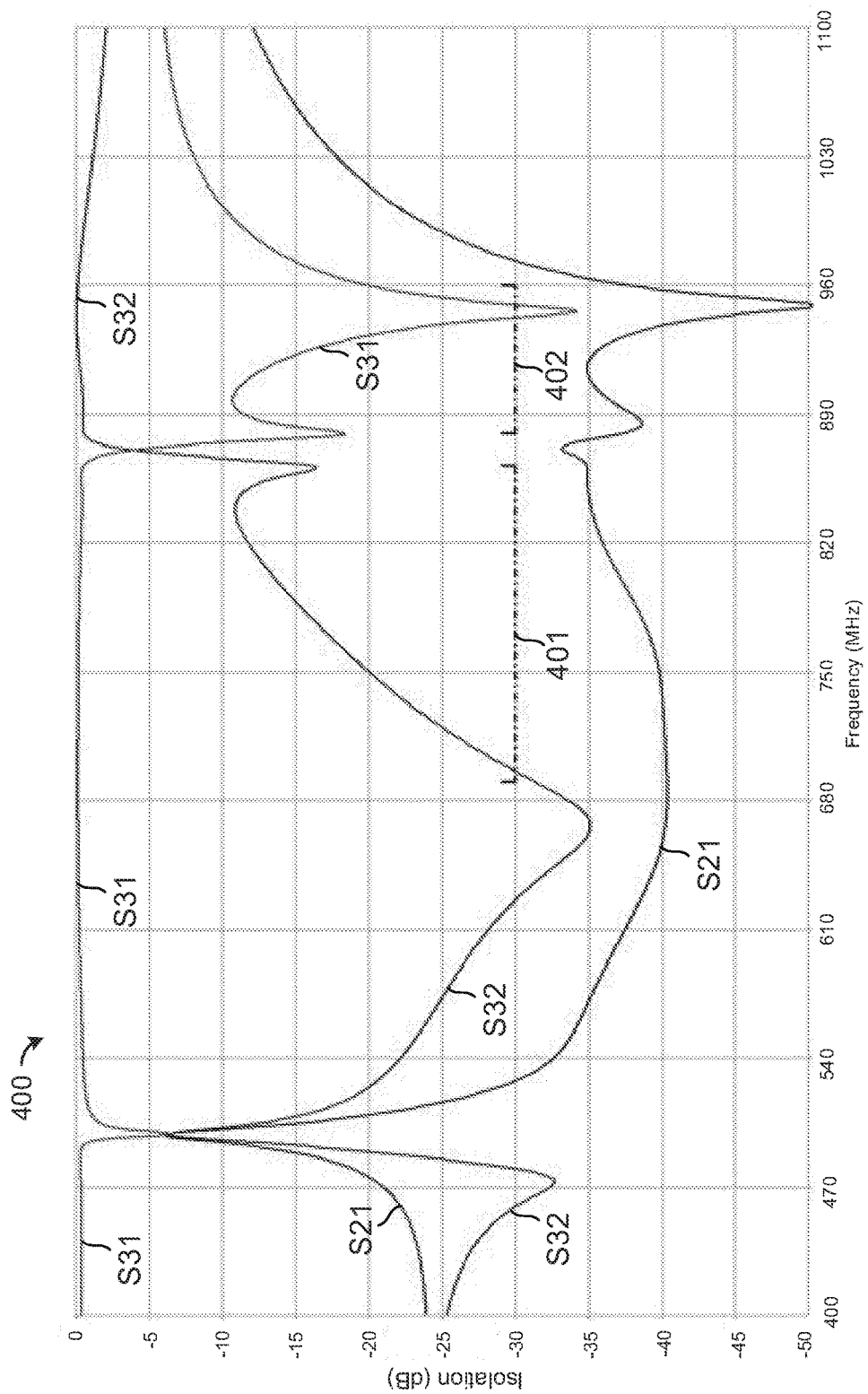
FIG. 4 is a diagram of a frequency response of a circuit according to embodiments of the present technology.

FIG. 4 is a diagram of a frequency response graph 400 of a circuit according to embodiments of the present technology. In an embodiment, graph 400 illustrates the frequency response of circuit 200 illustrated in FIG. 2. Graph 400 illustrates frequency bands 401 and 402 of between approximately 690 MHz and approximately 862 MHz and between approximately 880 MHz and approximately 960 MHz. Curve S31 represents a frequency response of signal provided at output 203 in response to a first signal provided to input 201. Similarly, curve S32 represents a frequency response of a signal provided at output 203 in response to a second signal provided to input 202. As can be seen, curves S31 and S32 have insertion loss of approximately 0.7 dB or less than 0.75 dB in frequency bands 401 and 402. Also, curve S21 illustrates an isolation between the first and second signals of approximately 35 dB or greater than approximately 30 dB in frequency bands 401 and 402.

Figure 5:
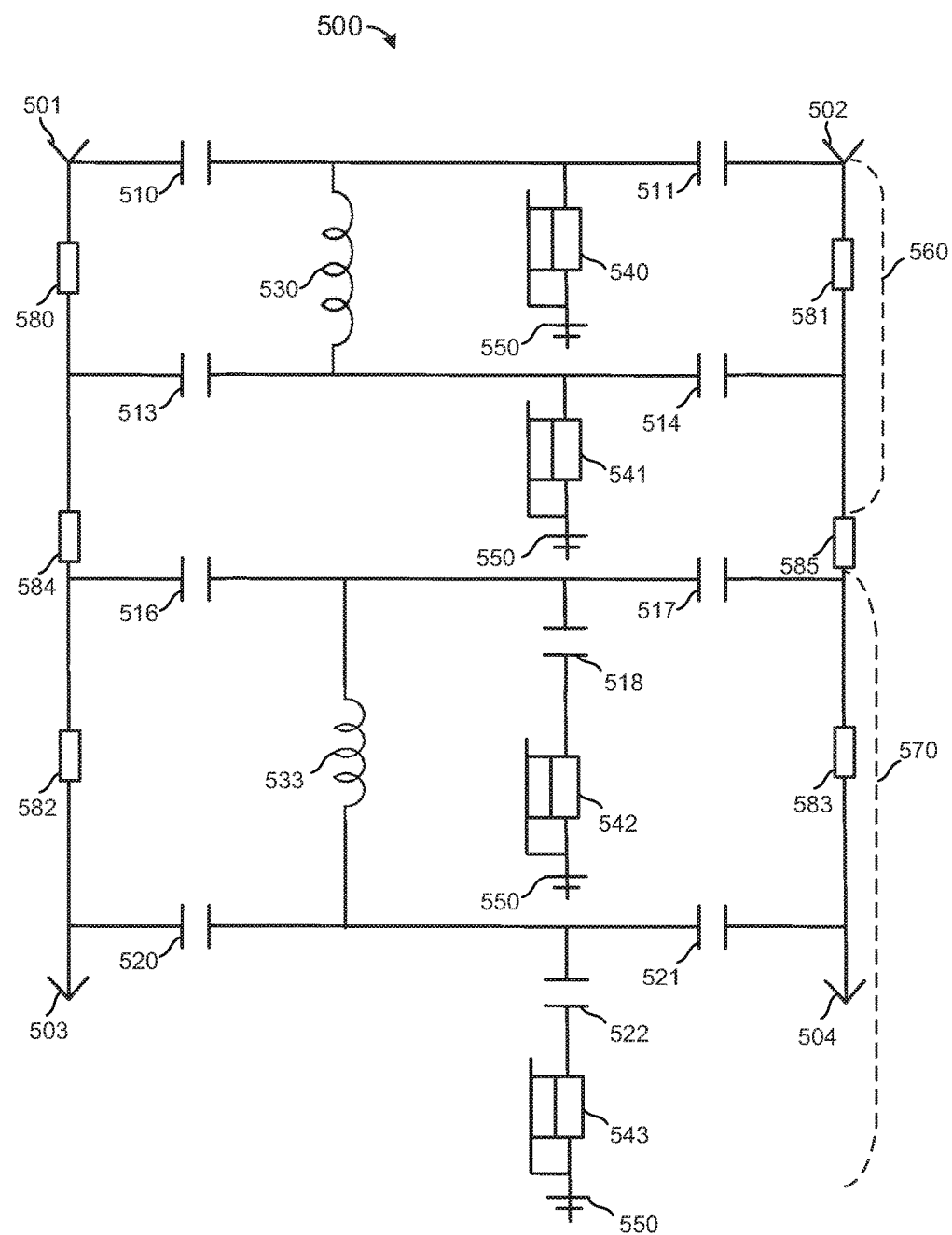
FIG. 5 is a schematic diagram of a circuit having resonators according to embodiments of the present technology.

FIG. 5 is a schematic diagram of a circuit 500 having resonators according to embodiments of the present technology. In an embodiment, circuit 500 is a combiner circuit having cascaded elliptic directional filters with ceramic resonators. In an embodiment, circuit 500 includes two stages: stage 560 having two inputs and stage 570 having an output (the other output coupled to a resistive load, such as 50 ohms). The two stages are connected through transmission lines 584 and 585 with a nominal phase difference of approximately 180 degrees.

First stage 560 includes an input 501 and an input 502 that may receive a first signal and a second signal respectively. A first signal may have a first frequency band range, such as 690-862 MHz and a second signal may have a second frequency band range, such as 880-960 MHz. Two ceramic resonators 540 and 541 are inductively coupled together through inductor 530. Resonator 540 is coupled to input 501 and input 502 through capacitors 510 and 511 respectively. Resonator 541 is coupled to the main signal paths (transmission lines) through capacitors 513 and 514 respectively. Transmission lines 580 and 581 are approximately 90 degrees in length nominally.

Second stage 570 includes two identical elliptically designed resonators in an embodiment. The first elliptic resonator includes ceramic resonator 542 and capacitor 518 in an embodiment, and the second elliptic resonator includes ceramic resonator 543 and capacitor 522 in an embodiment. Both ceramic resonators 542 and 543 are connected to ground (common) reference 550, indicating that they are quarter wave resonators in an embodiment. The first elliptic resonator is coupled to the main signal paths (transmission lines 582 and 583) through capacitors 516 and 517 respectively. The second elliptic resonator is coupled to the output port (output) 503 and terminated port 504 through capacitors 520 and 521 respectively.

In an embodiment, transmission lines 580, 584 and 582 couple input 501 to output 503. Similarly, transmission lines 581, 585 and 583 couple input 502 to output (or terminated port) 504. In embodiment, transmission lines 580, 584 and 582 form a first signal path and transmission lines 581, 585 and 583 form a second signal path. In an embodiment, transmission line 584 is a first portion of the first signal path and transmission line 585 is a second portion of the second signal path.

Figure 6:
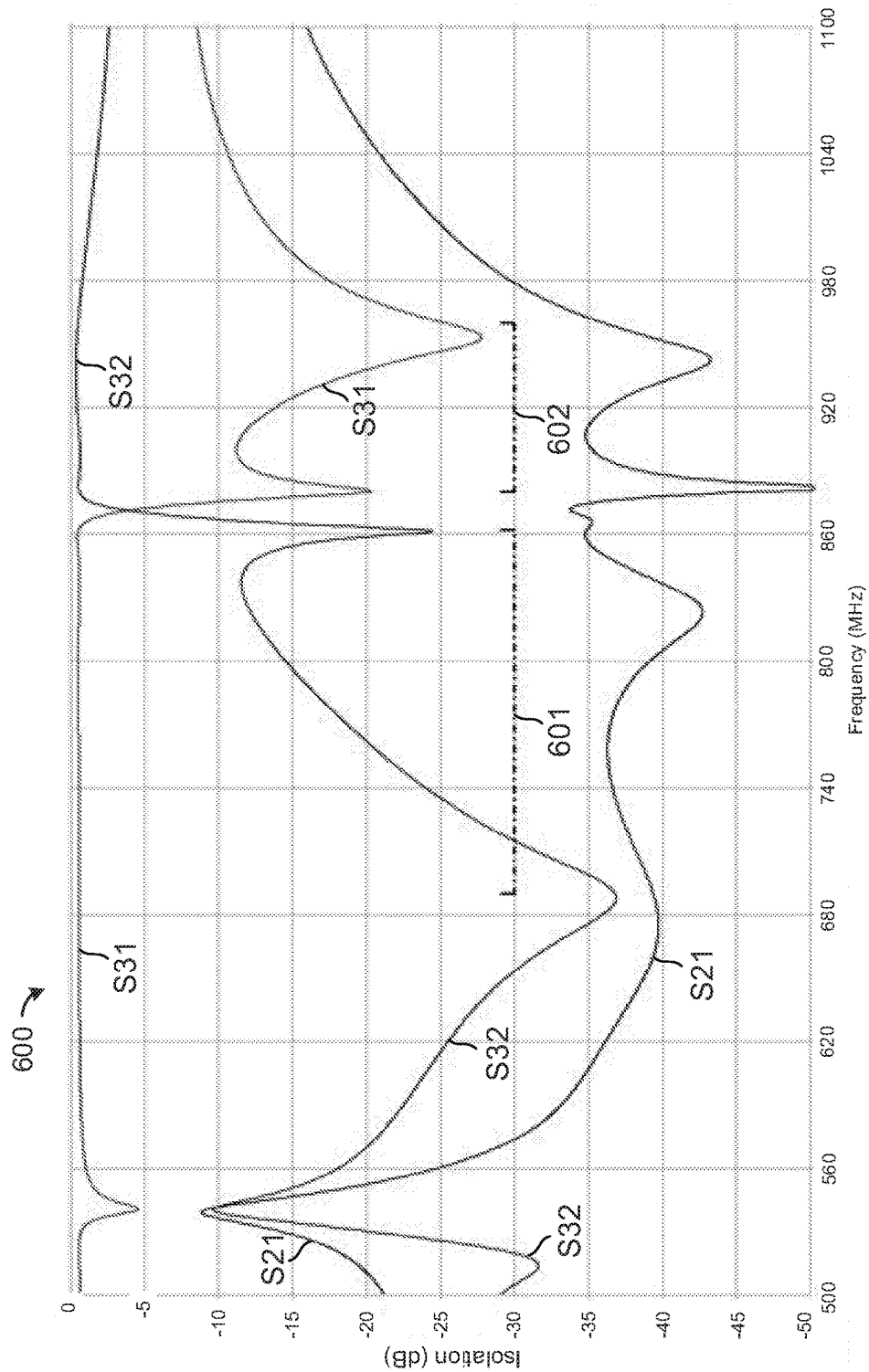
FIG. 6 is a diagram of a frequency response of a circuit according to embodiments of the present technology.

FIG. 6 is a diagram of a frequency response graph 600 of a circuit according to embodiments of the present technology. In an embodiment, graph 600 illustrates the frequency response of circuit 500 illustrated in FIG. 5. Similar to graph 400, graph 600 illustrates frequency bands 601 and 602 of between approximately 690 MHz and approximately 862 MHz and between approximately 880 MHz and approximately 960 MHz. Curve S31 represents a frequency response of signal provided at output 503 in response to a first signal provided to input 501 in circuit 500. Similarly, curve S32 represents a frequency response of a signal provided at output 503 in response to a second signal provided to input 502 in circuit 500. As can be seen, curves S31 and S32 have insertion losses of approximately 0.7 dB or less than 0.75 dB in frequency bands 601 and 602. Also, curve S21 illustrates an isolation between the first and second signals of approximately 35 dB or greater than approximately 30 dB in frequency bands 601 and 602. In an embodiment, graph 600 is provided with circuit 500 having one or more ceramic resonators with an unloaded Q factor (quality factor) of 800.

In an embodiment, an unloaded quality factor or Q factor (Q) is a dimensionless parameter that describes how underdamped an oscillator or resonator is and characterizes a resonator's bandwidth relative to its center frequency. In an embodiment, a higher unloaded Q indicates a lower rate of energy loss relative to the stored energy of a resonator; the oscillations die out more slowly. Resonators with high quality factors may have low damping so that they ring or vibrate longer in embodiments.

Figure 7A:
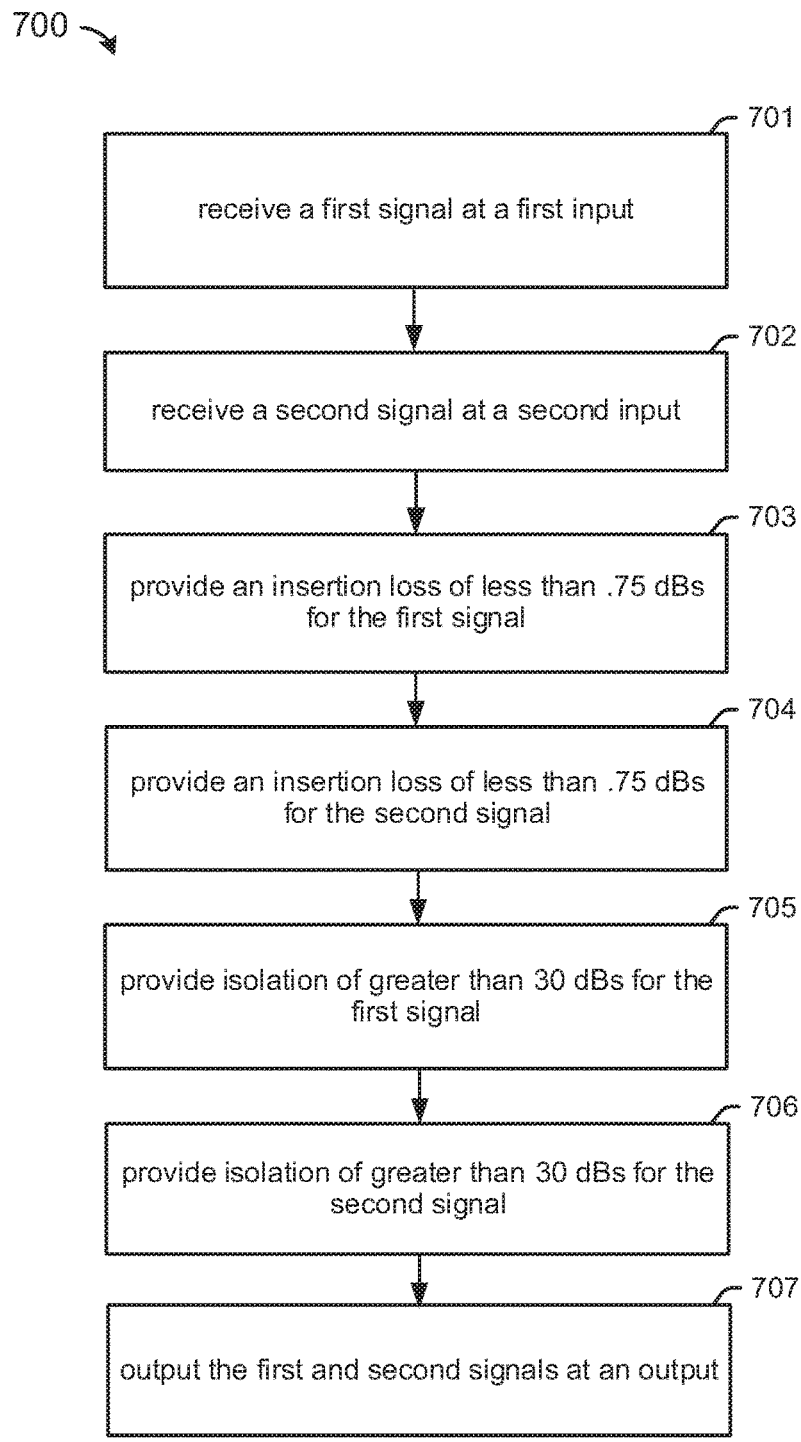
FIG. 7A is a flowchart that illustrates a method of operating a circuit according to embodiments of the present technology.
Figure 7B:
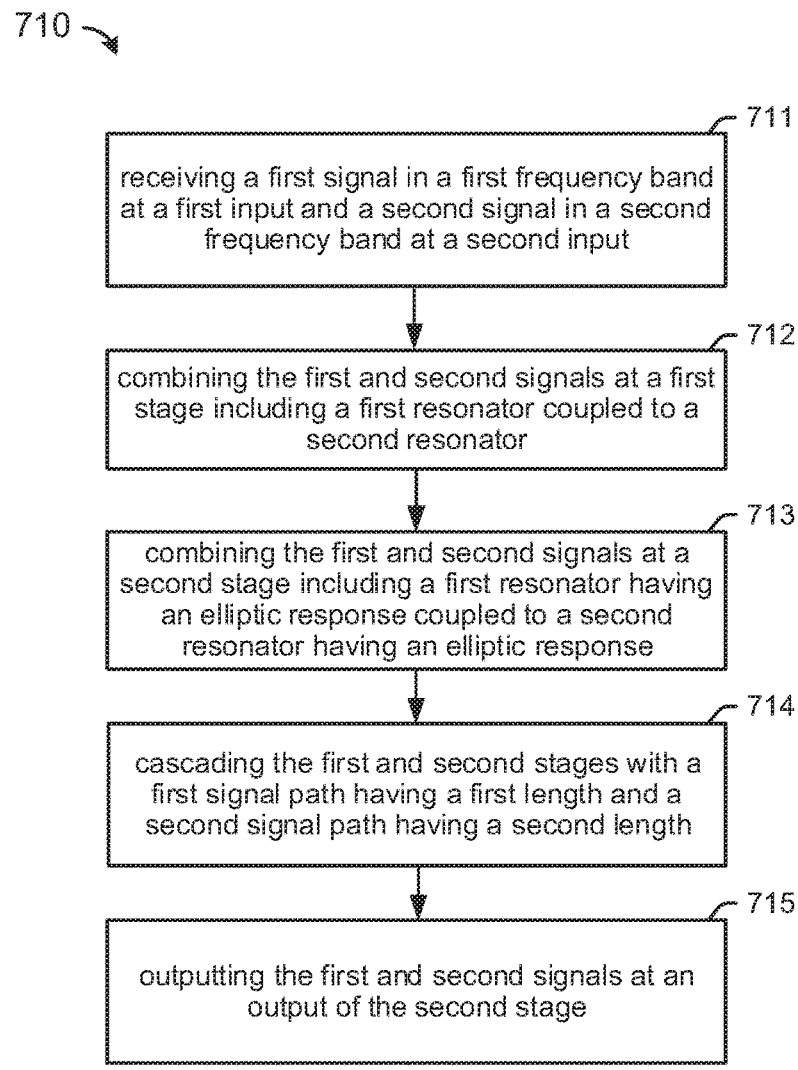
FIG. 7B is a flowchart that illustrates a method of operating a circuit according to embodiments of the present technology.

FIGS. 7A-B are flowcharts that illustrate a method 700 and 710 of operating a circuit according to embodiments of the present technology. In embodiments, methods 700 and 710 illustrate the operation of circuits 200, 280, 290 and/or 500 shown in FIGS. 2A-C and 5. In an embodiment, circuit or hardware components illustrated in circuits 200, 280, 290 and/or 500 perform at least some of the functions of methods 700 and 710. In alternate embodiments, software components may perform at least some of the function of methods 700 and 710.

In FIG. 7A at 701 a first signal is received at a first input. In an embodiment, this function as well as functions illustrated at 702-707 are performed by one or more components illustrated in FIGS. 2 and 5. For example, a first signal is received at inputs 201 or 501 of circuits 200 or 500 illustrated in FIGS. 2 and 5 in embodiments. In an embodiment, the first signal has a frequency range of between approximately 690 MHz and approximately 862 MHz.

At 702 a second signal is received at a second input. For example, a second signal is received at inputs 202 or 502 of circuits 200 or 500 illustrated in FIGS. 2 and 5. In an embodiment, the second signal has a frequency range of between approximately 880 MHz and approximately 960 MHz.

At 703 the first signal has an insertion loss of less than 0.75 dB.

At 704 the second signal has an insertion loss of less than 0.75 dB.

At 705 the first signal has an isolation of greater than 30 dB.

At 706 the second signal has an isolation of greater than 30 dB.

At 707 the first and second signals are output from an output, such as outputs 203 or 503 in embodiments.

FIG. 7B is a flowchart that illustrates a method 710 of operating a circuit according to embodiments of the present technology.

In FIG. 7B at 711 a first signal in a first frequency band at a first input and a second signal in a second frequency band at a second input is received. In an embodiment, this function as well as functions illustrated at 712-715 are performed by one or more components illustrated in FIGS. 2A-C and 5. For example, a first signal is received at inputs 201 or 501 of circuits 200 or 500 illustrated in FIGS. 2A and 5 in embodiments. In an embodiment, the first signal has a frequency range of between approximately 690 MHz and approximately 862 MHz.

At 712 the first and second signals are combined at a first stage including a first resonator coupled to a second resonator. In an embodiment, a first stage corresponds to stage 260 and/or 560 shown in FIGS. 2A and 5.

At 713 the first and second signals are combined at a second stage including a first resonator having an elliptic response coupled to a second resonator having an elliptic response. In an embodiment, a second stage corresponds to stage 270 and/or 570 shown in FIGS. 2A and 5.

At 714 the first and second stages are cascaded with a first signal path having a first length and a second signal path having a second length. In an embodiment, a first and second signal path corresponds to signal paths 244-245 and 584-585 shown in FIGS. 2A and 5.

At 715 the first and second signals are output at an output of the second stage. In an embodiment, an output corresponds to outputs 203 and 503 shown in FIGS. 2A and 5.

FIG. 8 illustrates a hardware architecture 800 of a base station 110 including computing device 801 (corresponding to computing device 102 shown in FIG. 1) coupled to antenna 101 via signal path(s) 106. Computing device 801 may be implemented in various embodiments. Computing device 801 may also include processor 840, memory 850 storing operating system 851, a user interface 860 and antenna interface 870 coupled by signal path 871. Signal path 871 may include a bus for transferring signals having one or more type of architectures, such as a memory bus, memory controller, a peripheral bus or the like.

Computing devices may utilize all of the hardware or software components, or a subset of the components in embodiments. Levels of integration may vary depending on an embodiment. For example, memory 850 may be divided into many more memories. Similarly, antenna interface 870 may be located external to computing device 801. Furthermore, a computing device 801 may contain multiple instances of a component, such as multiple processors (cores), memories, transmitters, receivers, etc. Computing device 801 may comprise a processor equipped with one or more input/output devices, such as network interfaces, storage interfaces, and the like.

In an embodiment, computing device 801 may be a mainframe computer that accesses a large amount of data related to a wireless network stored in a database. In an alternate embodiment, computing device 801 may be embodied as different type of computing device. In an embodiment, types of computing devices include but are not limited to, tablet, netbook, laptop, desktop, embedded, server and/or super (computer).

In an embodiment, antenna interface 870 obtains signals or values from antenna 101 via signal path(s) 106 in an embodiment. In an embodiment, antenna interface 870 includes a combiner circuit 103 with directional filters 104 and 105. In an embodiment, antenna interface 870 include one or more analog-to-digital converters and/or one or more transceivers to convert analog signals received by antenna interface 870 to digital values or data that are transferred by antenna interface 870 and stored in memory 850. In an embodiment, antenna interface 870 obtains data values from a 5G signal received at antenna 101 and stores the data values in memory 850 to be organized and processed.

Memory 850 stores data received from antenna interface 870 in an embodiments. In embodiments, software or software components are stored in memory 850. For example, computer programs such as an operating system 851, application(s) and/or other computer programs are stored in memory 850. In an embodiment, memory 850 also stores data received from a wireless network, such as cellular network.

In an embodiment, data stored in memory 850 may be accessed by processor 840 as well as user interface 860.

In an embodiment, processor 840 may include one or more types of electronic processors having one or more cores. In an embodiment, processor 840 is an integrated circuit processor that executes (or reads) computer instructions and/or data that may be included in code and/or computer programs stored on a non-transitory memory to provide at least some of the functions described herein. In an embodiment, processor 840 is a multi-core processor capable of executing multiple threads. In an embodiment, processor 840 is a digital signal processor, baseband circuit, field programmable gate array, digital logic circuit and/or equivalent. In an embodiment, processor 840 is a central processor unit (CPU).

A thread of execution (thread or hyper thread) is a sequence of computer instructions that can be managed independently in one embodiment. A scheduler, which may be included in an operating system, may also manage a thread. A thread may be a component of a process, and multiple threads can exist within one process, executing concurrently (one starting before others finish) and sharing resources such as memory, while different processes do not share these resources. In an embodiment, the threads of a process share its instructions (executable code) and its context (the values of the process's variables at any particular time).

Memory 850 may comprise any type of system memory such as static random access memory (SRAM), dynamic random access memory (DRAM), synchronous DRAM (SDRAM), read-only memory (ROM), a combination thereof, or the like. In an embodiment, a memory 850 may include ROM for use at boot-up, and DRAM for program and data storage for use while executing computer instructions. In embodiments, memory 850 is non-transitory or non-volatile integrated circuit memory storage.

Further, memory 850 may comprise any type of memory storage device configured to store data, computer programs including computer instructions, and other information and to make the data, computer programs, and other information accessible via signal path 871. Memory 850 may comprise, for example, one or more of a solid state drive, hard disk drive, magnetic disk drive, optical disk drive, or the like.

Computing device 801 may also include one or more network interfaces which may comprise wired links, such as an Ethernet cable or the like, and/or wireless links to access a network. In an embodiment, a network interface is included in antenna interface 870. A network interface allows computing device 801 to communicate with remote computing devices and/or other wireless networks. For example, a network interface may provide wireless communication via one or more transmitters/transmit antennas and one or more receivers/receive antennas.

In embodiments, functions described herein are distributed to other or more computing devices. In embodiments, computing device 801 may act as a server that provides a service while one or more UE, computing devices and/or associated base stations may act as a client. In an embodiment, computing device 801 and another computing device may act as peers in a peer-to-peer (P2P) relationship.

User interface 860 may include computer instructions as well as hardware components in embodiments. A user interface 860 may include input devices such as a touchscreen, microphone, camera, keyboard, mouse, pointing device and/or position sensors. Similarly, a user interface 860 may include output devices, such as a display, vibrator and/or speaker, to output images, characters, vibrations, speech and/or video as an output. A user interface 860 may also include a natural user interface where a user may speak, touch or gesture to provide input.

In embodiments, a signal path (described herein and/or illustrated in the figures) may include, but is not limited to, one or more of a wire, trace, transmission line, track, pad, layer, lead, metal, portion of a printed circuit board or assembly, conducting material and other material that may transfer or carry an electrical signal, light pulse and/or frequency. In embodiments, a signal path may form one or more geometric shapes, such as a line or multiple connected lines, and may or may not have arrows indicating signal flow direction. In embodiments, a signal path may by unidirectional or bidirectional in transferring signals between circuits and within circuits.

Advantages of the present technology may include, but are not limited to, higher performance, smaller package size, less weight and lower production costs. In particular, embodiments of the present technology provides improved isolation as compared to typical cascade directional filters. Other advantages includes improved insertion loss and fewer components used as compared to typical bandstop and bandpass circuits having the same package size. For similar electrical performance, embodiments of the present technology provides significant package size and weight (such as 50%) with lower cost as compared to typical bandstop and bandpass circuits.

The flowcharts and block diagrams in the figures illustrate the architecture, functionality, and operation of possible implementations of a circuit, device, apparatus, system, computer-readable medium and method according to various aspects of the present disclosure. In this regard, each block (or arrow) in the flowcharts or block diagrams may represent operations of a system component, software component or hardware component for implementing the specified logical function(s). It should also be noted that, in some alternative implementations, the functions noted in the block may occur out of the order noted in the figures. For example, two blocks (or arrows) shown in succession may, in fact, be executed substantially concurrently, or the blocks (or arrows) may sometimes be executed in the reverse order, depending upon the functionality involved. It will also be noted that each block (or arrow) of the block diagrams and/or flowchart illustration, and combinations of blocks (or arrows) in the block diagram and/or flowchart illustration, can be implemented by special purpose hardware-based systems that perform the specified functions or acts, or combinations of special purpose hardware and computer instructions.

It will be understood that each block (or arrow) of the flowchart illustrations and/or block diagrams, and combinations of blocks (or arrows) in the flowchart illustrations and/or block diagrams, may be implemented by non-transitory computer instructions. These computer instructions may be provided to and executed (or read) by a processor of a general purpose computer, special purpose computer, or other programmable data processing apparatus to produce a machine, such that the instructions executed via the processor, create a mechanism for implementing the functions/acts specified in the flowcharts and/or block diagrams.

As described herein, aspects of the present disclosure may take the form of at least a system, a device having one or more processors executing instructions stored in non-transitory memory, a circuit, a computer-implemented method, and/or a non-transitory computer-readable storage medium storing computer instructions.

In an embodiment, circuits as described herein, may be described as computer instructions stored in a non-transitory computer-readable storage medium.

Non-transitory computer-readable media includes all types of computer-readable media, including magnetic storage media, optical storage media, and solid state storage media and specifically excludes signals. It should be understood that software including computer instructions can be installed in and sold with a computing device having computer-readable storage media. Alternatively, software can be obtained and loaded into a computing device, including obtaining the software via a disc medium or from any manner of network or distribution system, including, for example, from a server owned by a software creator or from a server not owned but used by the software creator. The software can be stored on a server for distribution over the Internet, for example.

More specific examples of the computer-readable medium include the following: a portable computer diskette, a hard disk, a random access memory (RAM), ROM, an erasable programmable read-only memory (EPROM or Flash memory), an appropriate optical fiber with a repeater, a portable compact disc read-only memory (CD-ROM), an optical storage device, a magnetic storage device, or any suitable combination thereof.

Non-transitory computer instructions used in embodiments of the present technology may be written in any combination of one or more programming languages. The programming languages may include an object oriented programming language such as Java, Scala, Smalltalk, Eiffel, JADE, Emerald, C++, CII, VB.NET, Python, R or the like, conventional procedural programming languages, such as the "c" programming language, Visual Basic, Fortran 2003, Perl, COBOL 2002, PHP, ABAP, dynamic programming languages such as Python, Ruby and Groovy, or other programming languages. The computer instructions may be executed entirely on the user's computer, partly on the user's computer, as a stand-alone software package, partly on the user's computer and partly on a remote computer, or entirely on the remote computer or server. In the latter scenario, the remote computer may be connected to the user's computer through any type of network, or the connection may be made to an external computer (for example, through the Internet using an Internet Service Provider) or in a cloud computing environment or offered as a service such as a Software as a Service (SaaS).

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the detailed description of the present subject matter, numerous specific details are set forth in order to provide a thorough understanding of the present subject matter. However, it will be clear to those of ordinary skill in the art that the present subject matter may be practiced without such specific details.

Although the subject matter has been described in language specific to structural features and/or methodological steps, it is to be understood that the subject matter defined in the appended claims is not necessarily limited to the specific features or steps (acts) described above. Rather, the specific features and steps described above are disclosed as example forms of implementing the claims.

What is claimed is:

1. A circuit operation method comprising:
   receiving a first signal in a first frequency band at a first input and a second signal in a second frequency band at a second input;
   combining the first and second signals at a first stage including a first resonator coupled to a second resonator;
   combining the first and second signals at a second stage including a first resonator having an elliptic response coupled to a second resonator having an elliptic response;
   cascading the first and second stages with a first signal path having a first length and a second signal path having a second length; and
   outputting the first and second signals at an output of the second stage;
   wherein the first stage includes a first, second, third and fourth ports and the second stage includes a first, second, third and fourth ports, wherein the first and second ports of the first stage are capacitively coupled to the first and second inputs of the circuit, and the third and fourth ports of the first stage are coupled to the first and second ports of the second stage by the first and second signal paths, and wherein the third port of the second stage is capacitively coupled to the output and the fourth port of the second stage is terminated.

2. The method of claim 1, wherein the first resonator in the second stage includes a first capacitor coupled in parallel with an inductor.

3. The method of claim 2, wherein a second capacitor is coupled in series with the first capacitor coupled in parallel to provide the elliptic response.

4. The method of claim 3, wherein the elliptic response provides a zero in a frequency response.

5. The method of claim 4, wherein the second stage reduces a frequency separation between the first and second signals.

6. The method of claim 5, wherein the first length and second length is based on whether the first resonator and second resonator in the second stage are inductive coupled or capacitive coupled.

7. The method of claim 1, wherein the first resonator and second resonator in the second stage are inductive coupled or capacitive coupled.

8. The method of claim 1, wherein the first and second signal paths are first and second transmission lines.

9. The method of claim 1, wherein the first frequency band is between approximately 690 MHz and approximately 862 MHz and the second frequency band is between approximately 880 MHz and approximately 960 MHz.

10. The method of claim 9, wherein an insolation of first signal is greater than 30 decibels and an isolation of second signal is greater than 30 decibels.

11. The method of claim 1, wherein an insertion loss of first signal in is less than 0.75 decibels and an insertion loss of second signal is less than 0.75 decibels.

12. A circuit comprising:
a first input, coupled to first signal path, to receive a first signal in a first frequency band;
a second input, coupled to a second signal path, to receive a second signal in a second frequency band;
a first stage comprising,
a first resonator coupled to the first input via a first capacitor and the second input via a second capacitor;
a second resonator coupled to the first signal path via a third capacitor and the second signal path via a fourth capacitor;
a first inductor coupled between the first and third capacitors, and between the second and fourth capacitors;
a second stage, coupled to the first stage, via a first portion of the first signal path and a second portion of the second signal path that provides a phase difference of approximately 180 degrees, comprising,
a third resonator coupled to the first signal path via a fifth capacitor and sixth capacitor and the second signal path via the sixth capacitor and seventh capacitor;
a fourth resonator coupled to the first signal path via an eighth capacitor and a ninth capacitor and a terminated port via the ninth capacitor and a tenth capacitor;
a second inductor coupled between the fifth and eighth capacitors, and between the seventh and tenth capacitors; and
an output, coupled to the second stage, to output the first signal and the second signal.

13. The circuit of claim 12, wherein the third and fourth resonators are resonators with an elliptic response.

14. The circuit of claim 13, wherein the first, second, third and fourth resonators include respective pairs of inductors and capacitors coupled in parallel.

15. The circuit of claim 14, wherein at least one of the first, second, third or fourth resonators have an unloaded Q of approximately 800.

16. The circuit of claim 12, wherein the first frequency band is between approximately 690 MHz and approximately 862 MHz and the second frequency band is between approximately 880 MHz and approximately 960 MHz.

17. The circuit of claim 12, wherein the circuit is included in a wireless base station having an antenna to receive the first and second signals.

18. An apparatus for a cellular network, the apparatus comprising:
an antenna to receive a first signal in a first frequency band and second signal in a second frequency band from at least a user equipment; and
a combiner circuit to combine the first and second signals comprising:
a first input, coupled to a first signal path, to receive the first signal;
a second input, coupled to a second signal path, to receive the second signal;
a first stage comprising,
a first resonator coupled to the first input via a first capacitor and the second input via a second capacitor;
a second resonator coupled to the first signal path via a third capacitor and the second signal path via a fourth capacitor;
a first inductor coupled between the first and third capacitors, and between the second and fourth capacitors;
a second stage, coupled to the first stage via a first portion of the first signal path and a second portion of the second signal path, comprising,
a third resonator having an elliptic response coupled to the first signal path via a fifth capacitor and a sixth capacitor and the second signal path via the sixth capacitor and a seventh capacitor;
a fourth resonator having an elliptic response coupled to the first signal path via an eighth capacitor and a ninth capacitor and a terminated port via the ninth capacitor and a tenth capacitor;
a second inductor coupled between the fifth and eighth capacitors, and between the seventh and tenth capacitors; and
an output, coupled to the eighth capacitor and first signal path, to output the first and second signals.

19. The apparatus of claim 18, wherein the first frequency band is between approximately 690 MHz and approximately 862 MHz and the second frequency band is between approximately 880 MHz and approximately 960 MHz.

20. The apparatus of claim 19, wherein an insertion loss of first signal in the combiner circuit is less than 0.75 decibels and an insertion loss of second signal in the combiner circuit is less than 0.75 decibels.

21. The apparatus of claim 20, wherein an insolation of first signal in the combiner circuit is greater than 30 decibels and an isolation of second signal in the combiner circuit is greater than 30 decibels.

* * * * *